United States Patent
Cho

(10) Patent No.: US 12,119,044 B2
(45) Date of Patent: Oct. 15, 2024

(54) MEMORY DEVICES AND METHODS FOR CONTROLLING ROW HAMMER

(71) Applicant: Samsung Electronics Co., Ltd., Suwon-si (KR)

(72) Inventor: Seongjin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 124 days.

(21) Appl. No.: 18/052,644

(22) Filed: Nov. 4, 2022

(65) Prior Publication Data

US 2023/0178140 A1 Jun. 8, 2023

(30) Foreign Application Priority Data

Dec. 8, 2021 (KR) .................. 10-2021-0175213
Feb. 8, 2022 (KR) .................. 10-2022-0016430

(51) Int. Cl.
*G11C 11/40* (2006.01)
*G11C 11/406* (2006.01)
*G11C 11/4078* (2006.01)
*G11C 11/4096* (2006.01)

(52) U.S. Cl.
CPC .... *G11C 11/4078* (2013.01); *G11C 11/40615* (2013.01); *G11C 11/40622* (2013.01); *G11C 11/4096* (2013.01)

(58) Field of Classification Search
CPC .......... G11C 11/4078; G11C 11/40615; G11C 11/40622; G11C 11/4096; G11C 11/40603; G11C 11/408; G11C 7/10; G11C 8/14; G11C 11/4063
See application file for complete search history.

(56) References Cited

U.S. PATENT DOCUMENTS

| | | | |
|---|---|---|---|
| 9,087,602 B2 | 7/2015 | Youn et al. | |
| 9,431,085 B2 | 8/2016 | Greenberg et al. | |
| 10,770,127 B2 | 9/2020 | Shore et al. | |
| 11,054,995 B2 | 7/2021 | Schaefer et al. | |
| 11,094,369 B1 | 8/2021 | Joo et al. | |
| 2020/0349995 A1 | 11/2020 | Shore et al. | |
| 2020/0381040 A1* | 12/2020 | Penney | G11C 11/4085 |
| 2021/0158862 A1 | 5/2021 | Okuma | |
| 2021/0191815 A1 | 6/2021 | Muchherla et al. | |
| 2021/0193218 A1 | 6/2021 | Lee | |

FOREIGN PATENT DOCUMENTS

| | | |
|---|---|---|
| CN | 112889113 A | 6/2021 |
| CN | 113330518 A | 8/2021 |

* cited by examiner

*Primary Examiner* — Xiaochun L Chen
(74) *Attorney, Agent, or Firm* — Myers Bigel, P.A.

(57) ABSTRACT

Memory devices and methods for controlling a row hammer are provided. The memory device includes a memory cell array including a word line and a plurality of counter memory cells storing an access count value of the word line, and a control logic circuit configured to monitor a row address accessing the word line during a row hammer monitoring time frame and to determine the row address to be a row hammer address when the number of times the word line is accessed is greater than or equal to a threshold value, wherein the row hammer address is to be stored in an address storage. The control logic circuit is further configured to hold up a determination operation for a next row hammer address, based on activation of a latch full signal indicating that there is no free space to store the row hammer address in the address storage.

20 Claims, 10 Drawing Sheets

MEMORY DEVICES AND METHODS FOR CONTROLLING ROW HAMMER

CROSS-REFERENCE TO RELATED APPLICATIONS

This application is based on and claims priority under 35 U.S.C. § 119 to Korean Patent Application No. 10-2021-0175213, filed on Dec. 8, 2021, and Korean Patent Application No. 10-2022-0016430, filed on Feb. 8, 2022, in the Korean Intellectual Property Office, the disclosures of which are incorporated by reference herein in their entireties.

BACKGROUND

The present disclosure relates to semiconductor memory devices, and more particularly, to a memory device that is configured to control a row hammer such that row hammer address information is not evicted, or deleted, by holding up a next row hammer address determining operation until a row hammer address is target-refreshed, and a method of operating the memory device.

A system including semiconductor chips widely uses dynamic random access memory (DRAM) as main memory or working memory of the system to store data or instructions used by a host of the system and/or to perform a computational operation. In general, DRAM writes data or reads written data under control by a host. When a computational operation is performed, a host retrieves instructions and/or data from DRAM, executes the instructions, and/or uses the data to perform the computational operation. When there is a result of the computational operation, the host writes back the result of the computational operation to the DRAM. Accordingly, a host may request reliability, availability, and serviceability (RAS) functions of DRAM chips.

DRAM cell sizes are sometimes reduced to increase DRAM capacity and density. Some DRAM-based system sometimes experience an intermittent failure due to a heavy workload. The failure is traced by repeated accesses to a single memory row, that is, a row hammer. The repetitive accesses to a certain row may cause an increased rate of decay of adjacent rows (for example, victim rows) due to electromagnetic coupling between rows. Also, memory cells connected to the victim rows may be disturbed, and thus, data corruption, such as flip of memory cell data, may occur.

In order to control a row hammer, DRAM may monitor an intensively accessed row hammer address for a preset time. DRAM may store row hammer addresses in a register of an address storage, generate hammer refresh addresses indicating addresses of memory cell rows physically adjacent to memory cell rows corresponding to row hammer addresses, and target-refresh memory cells connected to the victim memory cell row corresponding to the hammer refresh address.

However, in general, DRAM may use limited registers (or latches) to control row hammers, and the number of row hammer addresses may be determined by the number of times of performing historical access for a certain time and furthermore may be determined by the number of registers storing the number of access times. As row hammer addresses are newly stored in registers, the row hammer addresses previously stored in the registers may be evicted or deleted, and thus, the monitored row hammer address may be missed. Victim rows adjacent to the missed row hammer address may be attenuated faster than the timing of an auto-refresh operation, thereby being vulnerable to row hammer.

Accordingly, in order to satisfy RAS expectation, there is a need for a memory device and an operating method thereof to control row hammer information not to be evicted or deleted until a memory cell row related to the row hammer information is target-refreshed.

SUMMARY

The present disclosure provides a memory device for controlling row hammer such that row hammer address information is not evicted or deleted by holding up a next row hammer address determination operation until a row hammer address is target-refreshed, and a method of operating the memory device.

According to an embodiment, a memory device comprises a memory cell array comprising a word line and a plurality of counter memory cells configured to store an access count value of the word line, and a control logic circuit configured to: monitor a row address accessing the word line during a row hammer monitoring time frame; determine the row address to be a row hammer address when the number of times the word line is accessed is greater than or equal to a threshold value, wherein the row hammer address is to be stored in an address storage. The control logic circuit is configured to hold up a determination operation for a next row hammer address, based on activation of a latch full signal indicating that there is no free space to store the row hammer address in the address storage.

According to another embodiment, a control logic circuit comprises a counter configured to: count a number of times a word line is accessed by a row address during a row hammer monitoring time frame; read an access count value of the word line from a plurality of counter memory cells connected to the word line accessed by the row address; increment the read access count value; and output an output value of the counter as the number of times the word line is accessed by the row address; a comparator configured to compare an output value of the counter with a threshold value to determine whether the row address is a row hammer address; and a latch circuit configured to store the row hammer address in an address storage based on a determination of the comparator, and configured to activate a latch full signal indicating that there is no free space to store the row hammer address in the address storage, wherein the output value of the counter related to a number of times accessing by a next row address is not provided to the comparator, in response to the activated latch full signal.

According to another embodiment, a method of operating a memory device comprising a plurality of memory cell rows comprises: monitoring a row address for accessing a word line during a row hammer monitoring time frame; determining the row address to be a row hammer address when the number of times accessing the word line is greater than or equal to a threshold value; storing the row hammer address in an address storage; activating a latch full signal indicating that there is no free space to store the row hammer address in the address storage; and holding up a determination operation for a next row hammer address based on the activating of the latch full signal.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

Figure 1:
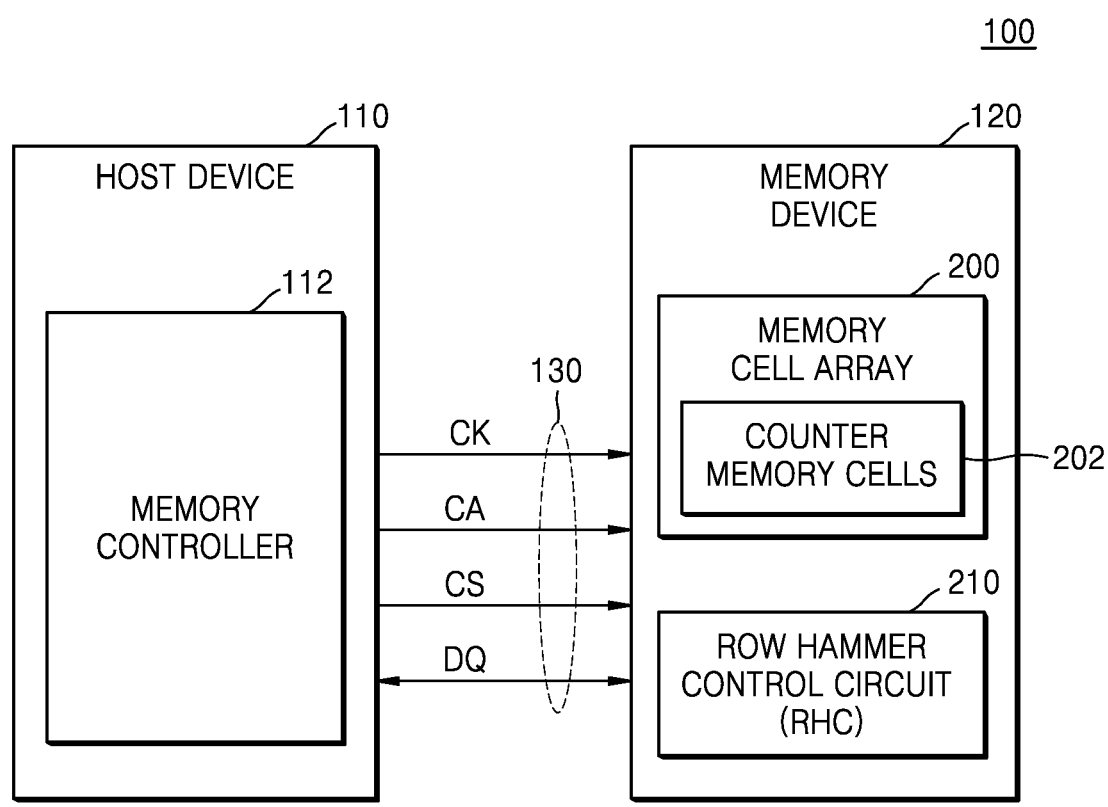
FIG. 1 is a block diagram illustrating a system including a memory device for controlling a row hammer, according to an example embodiment of the present disclosure.

FIG. 1 is a block diagram illustrating a system including a memory device for controlling a row hammer, according to an example embodiment of the present disclosure.

Referring to FIG. 1, a system 100 may include a host device 110 and a memory device 120. The host device 110 may be communicatively connected to the memory device 120 through a memory bus 130.

The host device 110 may include, for example, a computing system, such as a computer, a notebook computer, a server, a workstation, a portable communication terminal, a personal digital assistant (PDA), a portable multimedia player (PMP), a smartphone, and/or a wearable device. Alternatively, the host device 110 may include some of components included in a computing system, such as a graphics card.

The host device 110 may serve as a functional block that performs a general computer operation of the system 100 and may include a central processing unit (CPU), a digital signal processor (DSP), a graphics processing unit (GPU), and/or an application processor (AP). The host device 110 may include a memory controller 112 that controls data transmission and data reception to and from the memory device 120.

The memory controller 112 may access the memory device 120 according to a memory request from the host device 110. The memory controller 112 may include a memory physical layer interface (PHY) for interfacing with the memory device 120, such as selecting a row and a column corresponding to a memory location, writing data to a memory location, or reading written data. The memory PHY may include a physical or electrical layer and a logical layer provided for signals, frequency, timing, driving, detailed operating parameters, and functionality required for efficient communication between the memory controller 112 and the memory device 120. The memory PHY may support features of a double data rate (DDR) protocol and/or a low-power double data rate (LPDDR) protocol of the joint electron device engineering council (JEDEC) standard.

The memory controller 112 may be connected to the memory device 120 through the memory bus 130. For the sake of brief drawing, each of a clock signal CK, a command/address CA, a chip select signal CS, and data DQ is illustrated to be transmitted through one signal line of the memory bus 130 between the memory controller 112 and the memory device 120 but may be transmitted through a plurality of signal lines or buses. Signal lines between the memory controller 112 and the memory device 120 may be connected through connectors. The connectors may be implemented by pins, balls, signal lines, and/or other hardware components.

The clock signal CK may be transmitted from the memory controller 112 to the memory device 120 through a clock signal line of the memory bus 130. The command/address CA may be transmitted from the memory controller 112 to the memory device 120 through a command/address bus of the memory bus 130. A chip select signal CS may be transmitted from the memory controller 112 to the memory device 120 through a chip select line of the memory bus 130. For example, when the chip select signal CS is activated to a logic high level, a signal transmitted through the command/address bus may indicate a command. The data DQ may be transmitted from the memory controller 112 to the memory device 120 or from the memory device 120 to the memory controller 112 through a data bus, which may be composed of bidirectional signal lines, of the memory bus 130.

The memory device 120 may write the data DQ or read the data DQ and perform a refresh operation under control by the memory controller 112. For example, the memory device 120 may include a DDR synchronous dynamic random access memory (SDRAM) device. However, the scope of the present disclosure is not limited thereto, and the memory device 120 may include any one of volatile memory devices, such as an LPDDR SDRAM, a wide input/output (I/O) DRAM, a high bandwidth memory (HBM), and a hybrid memory cube (HMC). The memory device 120 may include a memory cell array 200 and a row hammer control circuit 210.

The memory cell array 200 may include a plurality of word lines, a plurality of bit lines, and a plurality of memory cells formed at intersections of the plurality of word lines and the plurality of bit lines. The plurality of memory cells in the memory cell array 200 may include volatile memory cells, for example, DRAM cells.

The memory cell array 200 may include counter memory cells 202 connected to the plurality of word lines. The counter memory cells 202 may store the number of times the corresponding word line is accessed. The row hammer control circuit 210 may monitor a row address that accesses a word line during a row hammer monitoring time frame and may determine the row address to be a row hammer address and store the row address in an address storage when the number of times the word line is accessed is greater than or equal to a threshold value. The row hammer control circuit 210 may hold up a determination operation for the next row hammer address based on activation of a latch full signal indicating that there is no free space to store the row hammer address in the address storage. As used herein, the term "hold" or "hold up" may mean, without limitation, to "block at least temporarily" or "pause at least temporarily" the determination operation for the next row hammer address based on the activation of the latch full signal. Accordingly, the memory device 120 may provide an increased RAS function by preventing the row hammer address stored in the address storage from being evicted or deleted until normally refreshed and/or target-refreshed, and preventing a row hammer attack from being easily performed.

Figure 2:
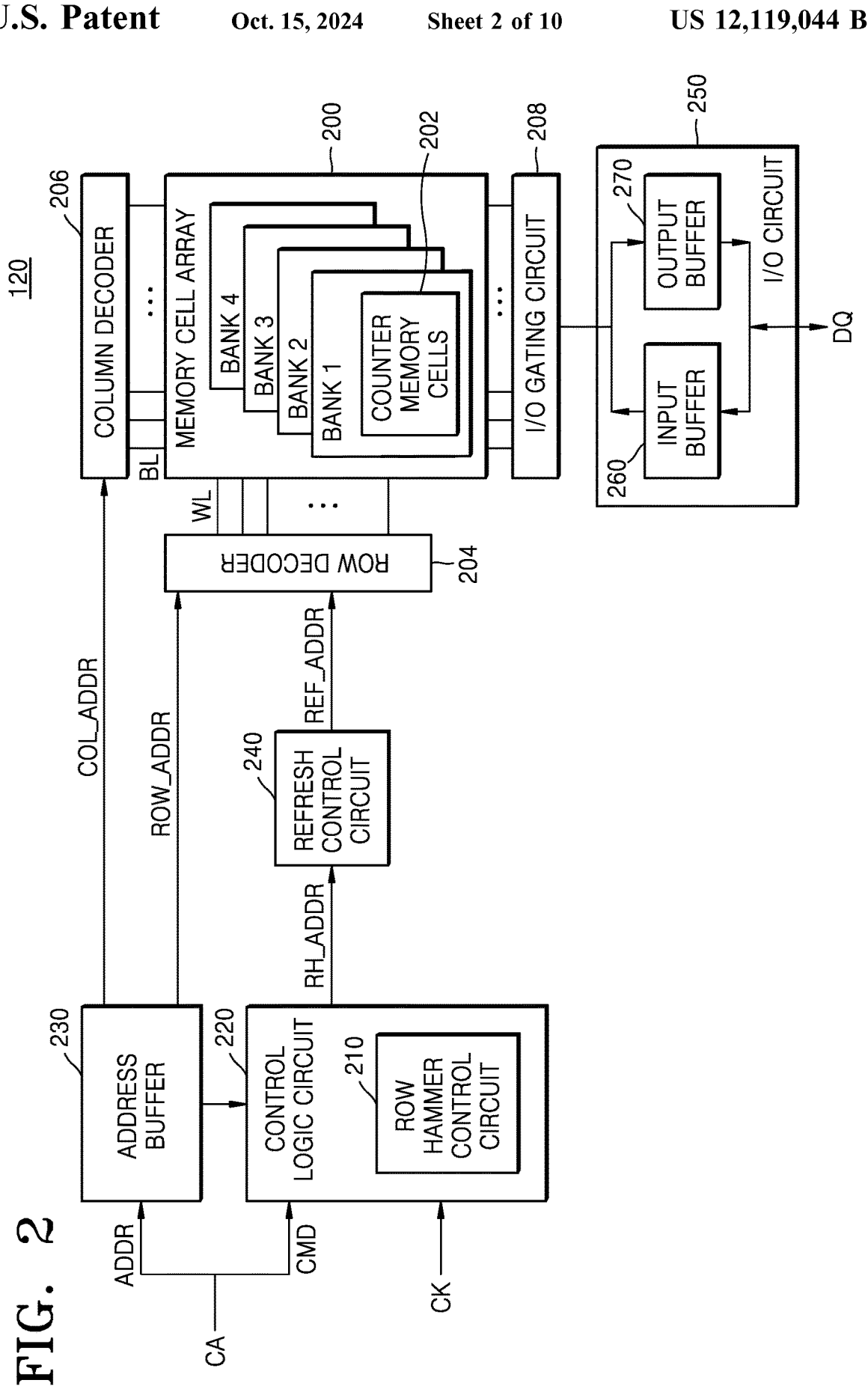
FIGS. 2 and 3 are block diagrams illustrating a memory device according to an embodiment of the present disclosure.
Figure 3:
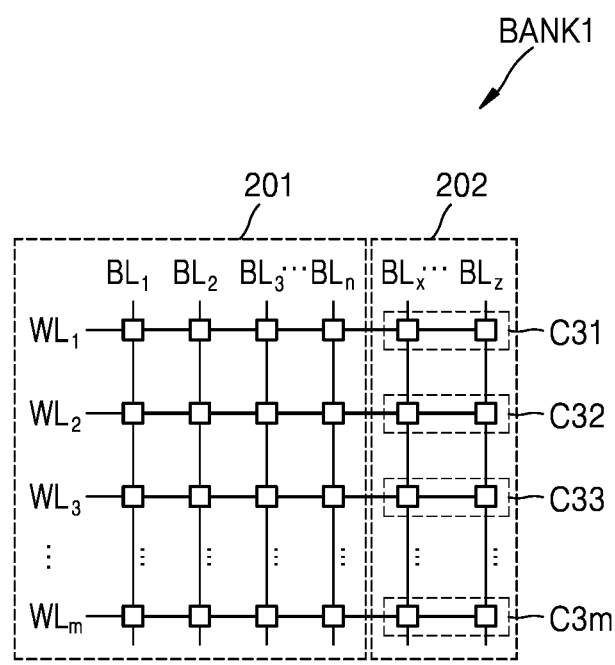
Figure 4:
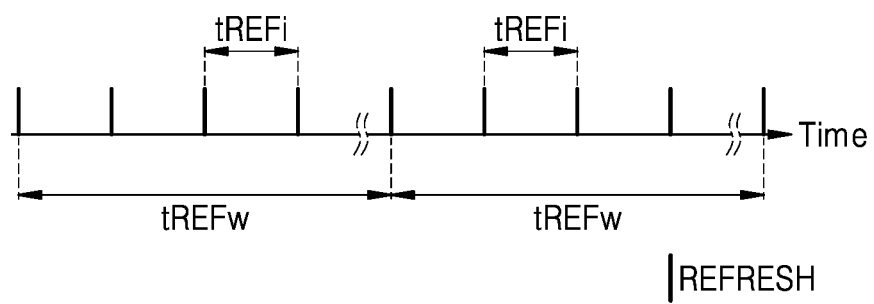
FIG. 4 is a diagram illustrating a refresh operation of the memory device illustrated in FIG. 2.

FIGS. 2 and 3 are block diagrams illustrating a memory devices according to an embodiment of the present disclosure. FIG. 2 illustrates the memory device 120 of FIG. 1 implemented as DRAM, and FIG. 3 illustrates a portion of the memory cell array 200 of FIG. 2. FIG. 4 is a diagram illustrating a refresh operation of the memory device of FIG. 2. It may be noted that a configuration of the DRAM illustrated in FIG. 2 is an example and is not a configuration of actual DRAM. In addition, the present disclosure is not limited by the example of the configuration of the DRAM illustrated in FIG. 2.

Referring to FIGS. 1 and 2, the memory device 120 may include a memory cell array 200, a row decoder 204, a column decoder 206, an input/output gating circuit 208, a control logic circuit 220, an address buffer 230, a refresh control circuit 240, and an input/output (I/O) circuit 250. Although not illustrated in FIG. 2, the memory device 120 may further include a clock buffer, a mode register set (MRS), a bank control logic, a voltage generation circuit, and so on.

The address buffer 230 may receive an address ADDR including a bank address, a row address ROW_ADDR, and a column address COL_ADDR from the memory controller 112. The address buffer 230 may provide the received bank address to the bank control logic, the received row address ROW_ADDR to the row decoder 204, and the received column address COL_ADDR to the column decoder 206.

The memory cell array 200 may include a plurality of memory cells arranged in rows and columns in a matrix. The memory cell array 200 may include a plurality of word lines WL and a plurality of bit lines BL connected to the plurality of memory cells. The plurality of word lines WL may be connected to rows of the plurality of memory cells, and the plurality of bit lines BL may be connected to columns of the plurality of memory cells. Data of memory cells connected to an activated word line WL may be sensed and amplified by sense amplifiers connected to the plurality of bit lines BL.

The memory cell array 200 may include first to fourth banks BANK1 to BANK4. The bank control logic may generate bank control signals in response to a bank address, and in response to the bank control signals, the row decoder 204 and the column decoder 206 of a bank corresponding to the bank address among the first to fourth banks BANK1 to BANK4 may be activated. Although the present embodiment illustrates an example of the memory device 120 including four banks, the memory device 120 may include any number of banks depending on embodiments.

The row decoder 204 and the column decoder 206 may be arranged to correspond to each of the first to fourth banks BANK1 to BANK4, and the row decoder 204 and the column decoder 206 connected to the bank corresponding to the bank address may be activated. The row decoder 204 may decode the row address ROW_ADDR received from the address buffer 230 to select a word line WL corresponding to the row address ROW_ADDR from among the plurality of word lines WL and may connect the selected word line WL to a word line driver that activates the plurality of word lines WL.

The column decoder 206 may select certain bit lines BL from among the plurality of bit lines BL of the memory cell array 200. The column decoder 206 may decode a burst address gradually incremented by +1 based on the column address COL_ADDR in a burst mode to generate a column select signal and may connect the bit lines BL selected by the column select signal to the input/output gating circuit 208. Burst addresses refer to addresses of column locations that may be accessed in terms of a burst length BL for a read and/or write command.

The input/output gating circuit 208 may include read data latches for storing read data of the bit lines BL selected by the column select signal, and a write driver for writing write data into the memory cell array 200. The input/output circuit 250 may include a data input buffer 260 and a data output buffer 270. Read data stored in the read data latches of the input/output gating circuit 208 may be provided to a data bus through the data output buffer 270. Write data may be written to the memory cell array 200 through the data input buffer 260 connected to the data bus and through the write driver of the input/output gating circuit 208.

The control logic circuit 220 may receive the clock signal CK and the command CMD and generate control signals for controlling an operation timing and/or a memory operation of the memory device 120. The control logic circuit 220 may provide control signals to circuits of the memory device 120 to operate as set in operations and control parameters stored by the MRS. The control logic circuit 220 may read data from and write data to the memory cell array 200 by using the control signals. Although the control logic circuit 220 and the address buffer 230 are illustrated as separate components in FIG. 2, the control logic circuit 220 and the address buffer 230 may be implemented as one inseparable component. In addition, although the command CMD and the address ADDR are illustrated as separate signals in FIG. 2, the address may be regarded as included in the command according to the LPDDR standard or so on.

The first bank BANK1 of the first to fourth banks BANK1 to BANK4 in the memory cell array 200 is representatively illustrated in FIG. 3. Referring to FIG. 3, the first bank BANK1 may include a plurality of word lines WL1 to WLm and a plurality of bit lines BL1 to BLn and BLx to BLz. In the first bank BANK1, a plurality of memory cells may be at intersections of the plurality of word lines WL1 to WLm and the plurality of bit lines BL1 to BLn and BLx to BLz. The plurality of memory cells respectively connected to the plurality of word lines WL1 to WLm in the first bank BANK1 may be divided into first memory cells 201 and second memory cells 202.

The first memory cells 201 connected to the plurality of word lines WL1 to WLm and the plurality of bit lines BL1 to BLn may store data and may be referred to as data cells. The second memory cells 202 connected to the plurality of word lines WL1 to WLm and the plurality of bit lines BLx to BLz may store the number of times corresponding word lines WL1 to WLm are accessed and may include first to m-th counter memory cells C31, C32, C33, and C3$m$. For the sake of convenient description, the first memory cells 201 may be referred to as data cells, and the second memory cells 202 may be referred to as counter memory cells.

For example, the first counter memory cells C31 connected to the first word line WL1 may store the number of access times for activating a memory cell row of the first word line WL1. The second counter memory cells C32 connected to the second word line WL2 may store the number of access times for activating a memory cell row of the second word line WL2, and the third counter memory cells C33 connected to the third word line WL3 may store the number of access times for activating a memory cell row of the third word line WL3. Similarly, the m-th counter memory cells C3$m$ may store the number of access times for activating a memory cell row of the m-th word line WLm.

The first to m-th counter memory cells C31, C32, C33, and C3m may also be repeated in each of the second to fourth banks BANK2 to BANK4 of the memory cell array 200. The number and positions of the first to m-th counter memory cells C31, C32, C33, and C3m may be reconfigured according to the greatest number of access times expected by the memory controller 112. In some embodiments, 8 to 24 counter memory cells may be provided in each word line. For example, 8, 12, 16, or 24 counter memory cells may be provided in each word line. In another example, more or fewer counter memory cells may be provided therein.

In FIG. 2, the control logic circuit 220 may count the number of times each of the memory cell rows in the memory cell array 200 is accessed and store the counted number of access times in the counter memory cells 202 connected to the plurality of word lines. The control logic circuit 220 may include a row hammer control circuit 210 that determines when the number of access times is greater than or equal to a threshold value and identifies a memory cell row having the number of access times that is greater than or equal to the threshold value as a row hammer dangerous row.

The row hammer control circuit 210 may be configured to monitor a row hammer for a memory cell row having the number of access times that are greater than or equal to a threshold value in the memory cell array 200 and to detect a row hammer of a preset memory cell row. The preset memory cell row refers to a memory cell row having the number of access times that are greater than or equal to a threshold value during a preset time period. As illustrated in FIG. 4, the preset time period may be set as a refresh window time tREFw of 32 milliseconds (ms) or 64 ms defined in the JEDEC standard. According to an embodiment, the preset time period may be set as a basic refresh rate time tREFi of FIG. 4. A basic refresh rate may be defined by, for example, the number of refresh commands REFRESH of about 8K within the refresh window of 32 ms. The preset time period may be referred to as a row hammer monitor time frame or a time window set by the memory controller 112.

According to an embodiment, the row hammer control circuit 210 may transmit information on a detected row hammer dangerous row to the memory controller 112. The memory controller 112 may issue a normal refresh command based on the row hammer dangerous row information. The memory controller 112 may transmit an address of a memory cell row physically adjacent to a row hammer dangerous row to the memory device 120 together with a refresh command. The memory device 120 may refresh a memory cell row physically adjacent to a row hammer dangerous row, according to a normal refresh command.

According to an embodiment, the row hammer control circuit 210 may be configured to target-refresh a memory cell row physically adjacent to a row hammer dangerous row. The row hammer control circuit 210 may include hardware, firmware, software, and/or a combination thereof for controlling or managing a row hammer. In the following embodiment, the row hammer control circuit 210 is described to control a row hammer accessed with a threshold value or more during a row hammer monitoring time frame, but embodiments of the present disclosure are not limited thereto. For example, it may be described that the row hammer control circuit 210 corresponds to a configuration provided in the control logic circuit 220, and the control logic circuit 220 controls a row hammer.

The control logic circuit 220 may control the refresh control circuit 240 to perform a normal refresh operation by incrementing a refresh counter value by +1 in response to a refresh command. Also, the control logic circuit 220 may control the refresh control circuit 240 to perform a target row refresh operation based on a row hammer address RH_ADDR. The refresh control circuit 240 may generate a refresh address REF_ADDR corresponding to a memory cell row on which a normal refresh operation and/or a target row refresh operation is to be performed.

Figure 5:
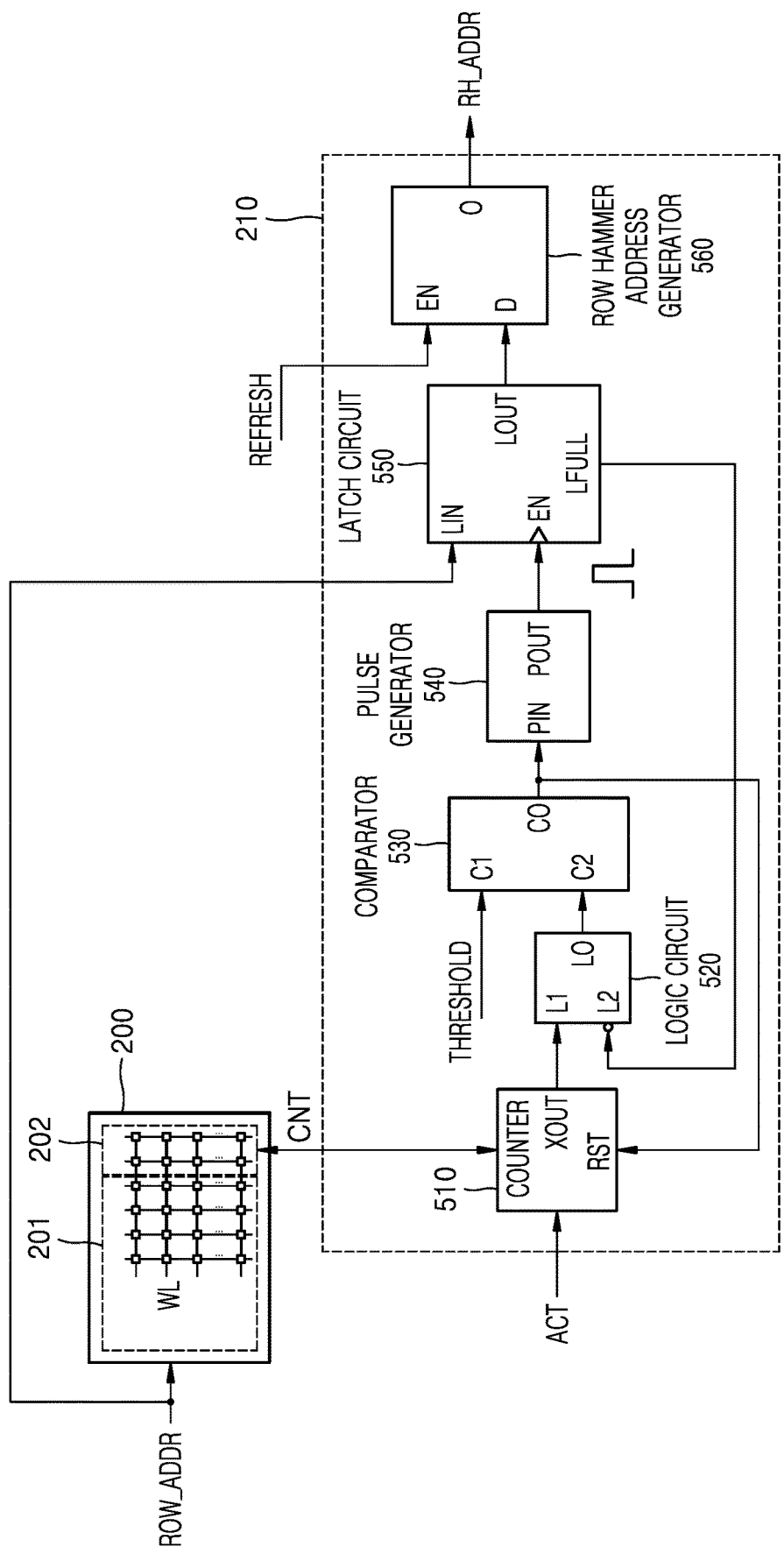
FIG. 5 is a block diagram illustrating a row hammer control circuit according to an embodiment of the present disclosure.

FIG. 5 is a block diagram illustrating a row hammer control circuit according to an embodiment of the present disclosure.

Referring to FIG. 5, the row hammer control circuit 210 may include a counter 510, a logic circuit 520, a comparator 530, a pulse generator 540, a latch circuit 550, and a row hammer address generator 560.

The counter 510, the logic circuit 520, and the comparator 530 may operate together to determine whether the number of times accessing a memory cell row associated with the row address ROW_ADDR applied together with an active command ACT is greater than or equal to the threshold value THRESHOLD. When the word line WL corresponding to the row address ROW_ADDR is accessed, an access count value CNT stored in the counter memory cells 202 connected to the word line WL may be read into the counter 510. The access count value CNT stored in the counter memory cells 202 may be understood as the number of times accessing the word line WL corresponding to the row address ROW_ADDR. The counter 510 may increment, by +1, the access count value CNT read by considering the currently applied active command ACT. An incremented access count value CNT+1 may be stored in the counter memory cells 202 connected to the word line WL. Also, the counter 510 may output the incremented access count value CNT+1 as an output signal XOUT of the counter 510.

In addition, the counter 510 may reset the output signal XOUT of the counter 510 to zero, in response to a reset RST signal. A reset RST signal line of the counter 510 may be connected to an output CO signal line of the comparator 530. The comparator 530 may output an output signal of a logic high level when the incremented access count value CNT+1 that is output from the counter 510 and transmitted through the logic circuit 520 is greater than or equal to the threshold value THRESHOLD. As an output CO signal of a logic high level of the comparator 530 is provided as a reset RST signal of the counter 510, the output signal XOUT of the counter 510 may be reset to a zero value.

The logic circuit 520 may include a first input L1 to which the output signal XOUT of the counter 510 is input, a second input L2 to which a latch full signal LFULL of the latch circuit 550 is input, and an output LO. The logic circuit 520 may include an AND gate. The logic circuit 520 may output the output signal XOUT of the counter 510 input to the first input L1 as an output signal thereof when the latch full signal LFULL input to the second input L2 is at a logic low level. The logic circuit 520 may output an output LO signal of a logic low level when the latch full signal LFULL input to the second input L2 is at a logic high level. The latch full signal LFULL may be provided by the latch circuit 550, and as the row hammer address is stored in an address storage included in the latch circuit 550 resulting in no free space in the address storage, the latch full signal LFULL may be provided at a logic high level. The logic circuit 520 may block the output signal XOUT of the counter 510 from being provided to the comparator 530 in response to the latch full signal LFULL of a logic high level.

The comparator 530 may include a first input C1 to which the threshold value THRESHOLD is input, a second input C2 to which an output LO of the logic circuit 520 is input, and an output CO. The threshold value THRESHOLD may be set by the memory controller 112 as a row hammer determination reference and provided by the MRS. The comparator 530 may compare an output LO signal of the logic circuit 520 input to the second input C2 with the threshold value THRESHOLD input to the first input C1. When the output signal XOUT with the incremented access count value CNT+1 output from the counter 510 is input to the second input C2, the comparator 530 may compare the incremented access count value CNT+1 with the threshold value THRESHOLD.

The pulse generator 540 may include an input PIN to which the output signal of the comparator 530 is input, and an output POUT. The pulse generator 540 may selectively output an output signal with a pulse shape according to a logic level of the output signal of the comparator 530. For example, the pulse generator 540 may output the output signal with a pulse shape when the output signal of the comparator 530 is at a logic high level. When the output signal of the comparator 530 is at a logic low level, the output signal of the pulse generator 540 may be output at a logic low level.

For example, when the incremented access count value CNT+1 is less than the threshold value THRESHOLD as a result of comparing the threshold value THRESHOLD input to the first input C1 with the incremented access count value CNT+1 input to the second input C2, the comparator 530 may output an output signal of a logic low level. The output signal of a logic low level of the comparator 530 may be provided to the pulse generator 540 and the counter 510. The pulse generator 540 may output an output POUT signal of a logic low level in response to the output signal of a logic low level of the comparator 530. In addition, the output CO signal of a logic low level of the comparator 530 may be provided as the reset RST signal of the counter 510 and act as an inactive signal for a reset operation of the counter 510. Accordingly, the counter 510 may continuously perform a count operation without being reset by the reset RST signal of a logic low level. The counter 510 may read the access counter value CNT associated with the next active command ACT and the next row address ROW_ADDR from the counter memory cells 202, increment the read access count value CNT by +1, store the incremented access count value CNT+1 in the counter memory cells 202 connected to the word line WL corresponding to the next row address ROW_ADDR, and provide the incremented access count value CNT+1 to the logic circuit 520 as the output signal XOUT.

For example, when the incremented access count value CNT+1 is greater than or equal to the threshold value THRESHOLD as a result of comparing the threshold value THRESHOLD input to the first input C1 with the incremented access count value CNT+1 input to the second input C2 by using the comparator 530, the comparator 530 may output the output CO signal of a logic high level. The output CO signal may be provided to the pulse generator 540 and the counter 510. The pulse generator 540 may output an output POUT signal having a pulse shape, in response to the output CO signal of a logic high level of the comparator 530. In addition, the output CO signal of a logic high level of the comparator 530 may be provided as the reset RST signal of the counter 510 and act as an activation signal for a reset operation of the counter 510 to reset the output signal XOUT of the counter 510 to a zero value.

The latch circuit 550 and the row hammer address generator 560 store the row address ROW_ADDR with the number of access times that are greater than or equal to the threshold value THRESHOLD and may operate together to perform a normal refresh operation and/or a target row refresh operation of the stored row address ROW_ADDR as the row hammer address RH_ADDR. The latch circuit 550 may store the row address ROW_ADDR in an address storage and activate the latch full signal LFULL to a logic high level when there is no free space in the address storage. The latch full signal LFULL may be deactivated to a logic low level when the row address ROW_ADDR stored in the address storage is transmitted to the row hammer address generator 560 in response to the refresh signal REFRESH. The row hammer address generator 560 may provide the received row address ROW_ADDR to the refresh control circuit 240 (FIG. 2) as the row hammer address RH_ADDR to perform a normal refresh operation and/or a target row refresh operation.

The latch circuit 550 may include a first input EN to which the output POUT signal of the pulse generator 540 is input, a second input LIN to which the row address ROW_ADDR is input, and an output LOUT, and may output the latch full signal LFULL indicating that an address storage in the latch circuit 550 is full. The latch circuit 550 may be enabled when the output POUT signal of the pulse generator 540 applied to the first input EN has a pulse shape. When the output POUT signal of the pulse generator 540 is applied at a logic low level, the latch circuit 550 is disabled.

When the output POUT signal of the pulse generator 540 is applied to the first input EN, the latch circuit 550 stores the row address ROW_ADDR input to the second input LIN in an address storage. The output POUT signal having a pulse shape output from the pulse generator 540 indicates that the number of times accessing by the row address ROW_ADDR corresponding to the active command ACT is greater than or equal to the threshold value THRESHOLD, which means that the row address ROW_ADDR corresponds to a row hammer address.

The latch circuit 550 may store the row address ROW_ADDR in a latch of an address storage, in response to the output POUT signal having a pulse shape output from the pulse generator 540, and output, at a logic high level, the latch full signal LFULL indicating that the address storage is full. The latch full signal LFULL of a logic high level may be provided to the logic circuit 520 to block the output signal XOUT of the counter 510 from being provided to the comparator 530. In the present embodiment, the address storage of the latch circuit 550 is described as including one latch. In some embodiments, the address storage of the latch circuit 550 may be configured to include two or more latches.

The latch circuit 550 may output the row address ROW_ADDR stored in the address storage as an output LOUT signal. The output LOUT signal of the latch circuit 550 may be provided to the row hammer address generator 560. The row hammer address generator 560 may include a first input EN to which the refresh signal REFRESH is input, a second input D to which the output LOUT signal of the latch circuit 550 is input, and an output O. The row hammer address generator 560 is enabled when the refresh signal REFRESH is applied to the first input EN and may output, as an output O signal, the row address ROW_ADDR which corresponds to the output LOUT signal of the latch circuit 550 and is stored in the address storage. The row hammer address generator 560 may output the row address ROW_ADDR stored in the address storage as a row hammer address RH_ADDR in response to the refresh signal REFRESH.

The row hammer address RH_ADDR may be provided to the refresh control circuit 240, and the refresh control circuit 240 may generate the refresh address REF_ADDR based on the row hammer address RH_ADDR. The refresh address REF_ADDR may refer to a memory cell row for performing a normal refresh operation and/or a target row refresh operation.

Figure 6:
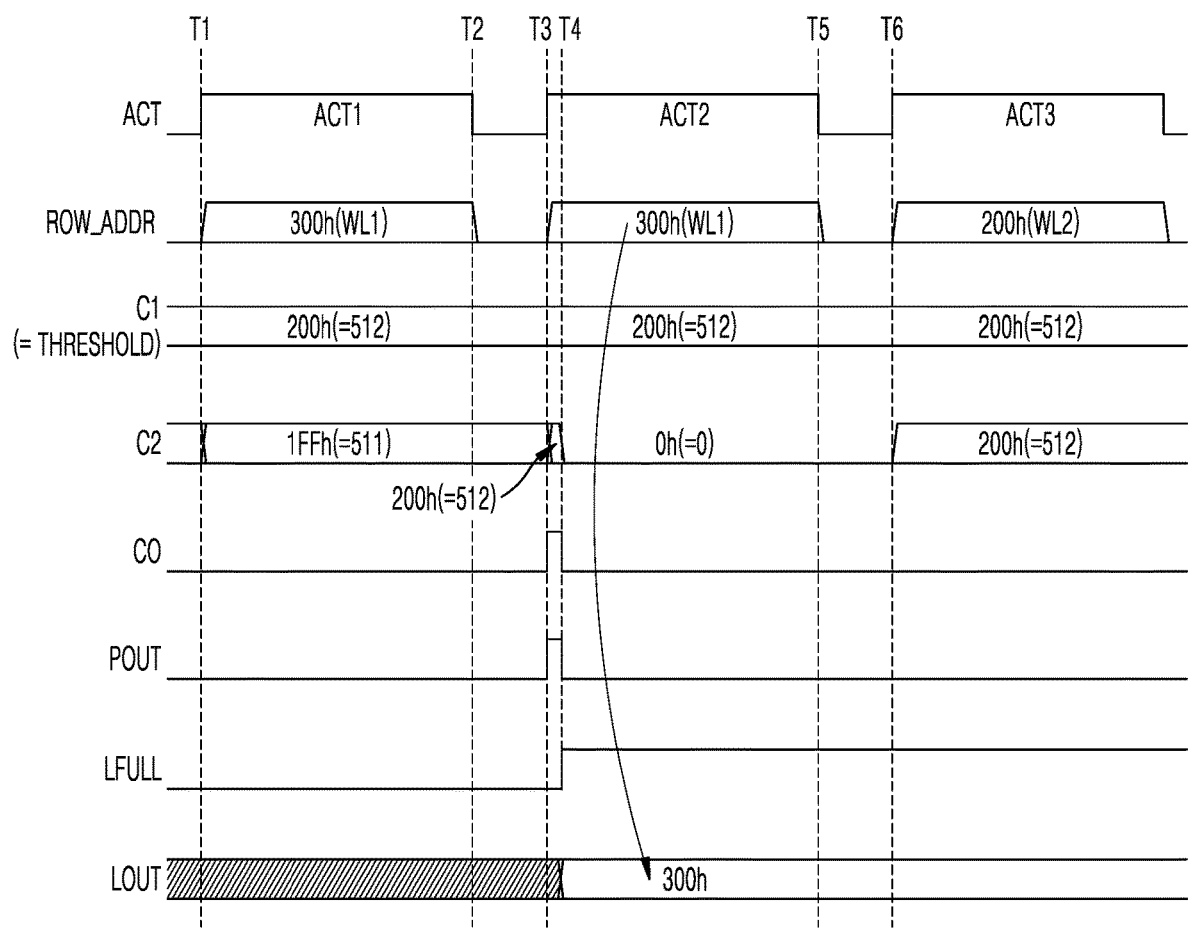
FIG. 6 is a diagram illustrating a row hammer control operation according to an embodiment of the present disclosure.

FIG. 6 is a diagram illustrating a row hammer control operation according to an embodiment of the present disclosure.

Referring to FIGS. 2, 5, and 6, the row address ROW_ADDR may be applied to the memory device 120 together with the active command ACT at time T1. For the sake of convenience of description, the active command ACT applied together with the row address ROW_ADDR of 300 h at the time T1 is referred to as a first active command ACT1, the active command ACT applied together with the row address ROW_ADDR of 300 h at time T3 is referred to as a second active command ACT2, and the active command ACT applied together with the row address ROW_ADDR of 200 h at time T6 is referred to as a third active command ACT3. In addition, it is assumed that the threshold value THRESHOLD applied to the first input C1 of the comparator 530 is set to 200 h, that is, 512.

From the time T1 to time T2, the row address ROW_ADDR of 300 h may be applied together with the first active command ACT1. The counter 510 may read the access count value CNT stored in the counter memory cells 202 connected to the word line WL corresponding to the row address ROW_ADDR of 300 h of the memory cell array 200 and may provide a value, for example, 1FFh, which is an output value XOUT of the counter 510 obtained by incrementing the read access count value CNT by +1, that is, 511 to the second input C2 of the comparator 530. In addition, the counter 510 may store 1FFh, which is the output value XOUT of the counter 510, that is, 511 in the counter memory cells 202 connected to the word line WL corresponding to the row address ROW_ADDR of 300 h. The comparator 530 may compare the threshold value THRESHOLD of 200 h input to the first input C1, that is, 512 with 1FFh, which is the output value XOUT of the counter 510 input to the second input C2, that is, 511, and may output the output CO signal of a logic low level. Accordingly, the pulse generator 540 may output the output POUT signal of a logic low level, and the latch circuit 550 may output the latch full signal LFULL of a logic low level.

From the time T3 to time T5, the row address ROW_ADDR of 300 h may be applied together with the second active command ACT2. At the time T3, the counter 510 may read the access count value CNT, which is stored in the counter memory cells 202 connected to the word line WL corresponding to the row address ROW_ADDR of 300 h of the memory cell array 200, for example, 1FFh, that is 511 and may provide the second input C2 of the comparator 530 with 200 h, which is the output value XOUT of the counter 510, obtained by incrementing the read access count value CNT by +1, that is, 512. In addition, the counter 510 may store 200 h, which is the output value XOUT of the counter 510, that is 512, in the counter memory cells 202 connected to the word line WL corresponding to the row address ROW_ADDR of 300 h. The comparator 530 may compare the threshold value THRESHOLD of 200 h input to the first input C1, that is, 512 with 200 h, which is the output value XOUT of the counter 510 input to the second input C2, that is 512, and may output the output CO signal of a logic high level.

At time T4, the output value XOUT of the counter 510 may be reset to 0 h in response to the output CO signal of a logic high level of the comparator 530. The counter 510 may store 0 h which is the output value XOUT of the counter 510, that is zero, in the counter memory cells 202 connected to the word line WL corresponding to the row address ROW_ADDR of 300 h. Accordingly, the second input C2 of the comparator 530 may be output as 0 h, which is the output value XOUT of the counter 510, that is zero. The comparator 530 may compare the threshold value THRESHOLD of 200 h input to the first input C1, that is, 512 with 0 h, which is the output value XOUT of the counter 510 input to the second input C2, that is zero, and may output the output CO signal of a logic low level.

Between the time T3 and the time T4, the output CO signal of the comparator 530 may be output at a logic high level. The pulse generator 540 may output the output POUT signal having a pulse shape, in response to an output CO signal of a logic high level output from of the comparator 530.

At the time T4, the latch circuit 550 may store the row address ROW_ADDR corresponding to the second active command ACT2 in an address storage in response to the output POUT signal having a pulse shape output from the pulse generator 540. The latch circuit 550 may store the row address ROW_ADDR of 300 h in a latch of an address storage and output, at a logic high level, the latch full signal LFULL indicating that the address storage is full. The latch full signal LFULL of a logic high level may be provided to the logic circuit 520 to block the output value XOUT of the counter 510 from being provided to the comparator 530. Also, the latch circuit 550 may output, as the output LOUT signal, the row address ROW_ADDR of 300 h stored in the address storage. An output LOUT signal 300 h of the latch circuit 550 may be provided to the row hammer address generator 560. The row hammer address generator 560 may output the output LOUT signal 300 h of the latch circuit 550 as the row hammer address RH ADDR, in response to the refresh signal REFRESH. The row hammer address RH_ADDR of 300 h may be provided to the refresh control circuit 240 (see FIG. 2), and the refresh address REF_ADDR may be generated based on the row hammer address RH_ADDR of 300 h.

At the time T6, the row address ROW_ADDR of 200 h may be applied together with the third active command ACT3. The counter 510 may read the access count value CNT stored in the counter memory cells 202 connected to the word line WL corresponding to the row address ROW_ADDR of 200 h of the memory cell array 200 and may output a value, for example 200h, which is the output value XOUT of the counter 510, obtained by incrementing the read access count value CNT by +1, that is 512. 200 h, which is the output value XOUT of the counter 510 with respect to the row address ROW_ADDR of 200 h, that is 512, is greater than or equal to the threshold value THRESHOLD of 200 h, that is 512, and thus, the row address ROW_ADDR may correspond to a row hammer address.

However, 200 h, which is the output value XOUT of the counter 510, that is, 512, is not provided to the comparator 530 by the latch full signal LFULL of a logic high level provided to the logic circuit 520. This means that the next row hammer determination operation is held until the row hammer address RH_ADDR of 300 h is normally refreshed and/or target-row-refreshed by the refresh control circuit 240. Accordingly, the row hammer address RH_ADDR of 300 h is not evicted or deleted by the row address ROW_ADDR of 200 h to be determined as the next row hammer address. The row address ROW_ADDR of 200 h may be determined as the row hammer address RH_ADDR after a normal refresh operation and/or a target row refresh operation for the row hammer address RH_ADDR of 300 h.

Figure 7:
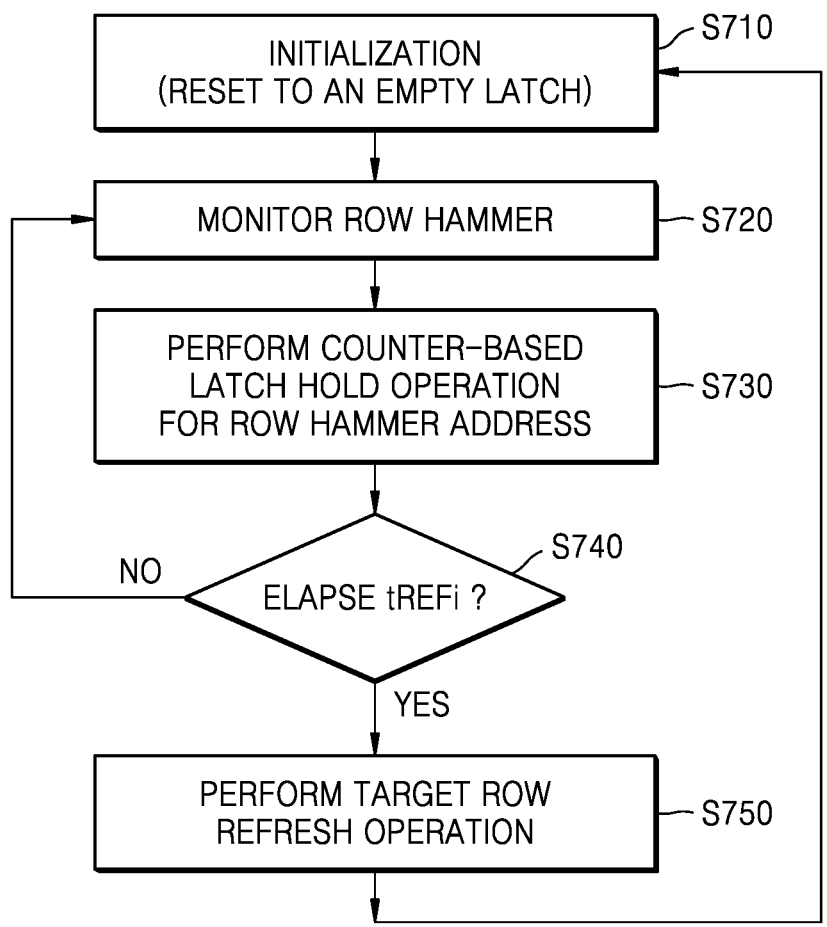
FIG. 7 is a flowchart illustrating an operation of a control logic circuit according to an embodiment of the present disclosure.

FIG. 7 is a flowchart illustrating an operation of a control logic circuit, according to an embodiment of the present disclosure.

Referring to FIG. 7 in conjunction with FIGS. 1 to 6, the system 100 may perform initialization in operation S710. When the system 100 is powered up, the memory controller 112 and the memory device 120 may perform an initial setting operation according to a preset method. Default operation parameters may be set in initialization of the memory device 120. For example, the threshold value THRESHOLD, which is a row hammer determination reference, may be set, and a row hammer monitor time frame tREFi may be set. Also, an address storage in the latch circuit 550 of the row hammer control circuit 210 may be reset to an empty latch state.

In operation S720, the control logic circuit 220 may perform an operation of monitoring a row hammer. The control logic circuit 220 may monitor a row address that accesses a word line.

In operation S730, the control logic circuit 220 may perform a counter-based latch hold operation on the row hammer monitored in operation S720. In operation S730, when the number of times accessing the word line is greater than or equal to a threshold value, the control logic circuit 220 may determine the row address to be a row hammer address and store the row address in the address storage. The control logic circuit 220 may hold up a determination operation for the next row hammer address, based on activation of the latch full signal LFULL indicating that there is no free space to store the row hammer address in the address storage. Operation S730 will be described in detail with reference to FIG. 8.

In operation S740, the control logic circuit 220 may determine whether the row hammer monitoring time frame tREFi elapses. When the row hammer monitoring time frame tREFi has not elapsed (NO), the processing may proceed back to operation S720. The control logic circuit 220 may perform a counter-based latch hold operation for the row hammer address RH_ADDR to be obtained in operation S730. Otherwise, when the row hammer monitor time frame tREFi has elapsed (YES), the processing may proceed to operation S750.

In operation S750, the control logic circuit 220 may perform a normal refresh and/or a target row refresh operation for the row hammer address RH_ADDR obtained in operation S730. After the control logic circuit 220 performs a normal refresh and/or a target row refresh operation for the row hammer address RH_ADDR, the processing may proceed back to operation S710. In operation S710, the control logic circuit 220 may reset, to an empty latch state, the address storage of the latch circuit 550 storing the row address ROW_ADDR corresponding to the row hammer address RH_ADDR by which the normal refresh operation and/or the target row refresh operation has been performed. Accordingly, the control logic circuit 220 may monitor the next row hammer address RH_ADDR and store the monitored row hammer address RH_ADDR in an empty latch of the address storage.

Figure 8:
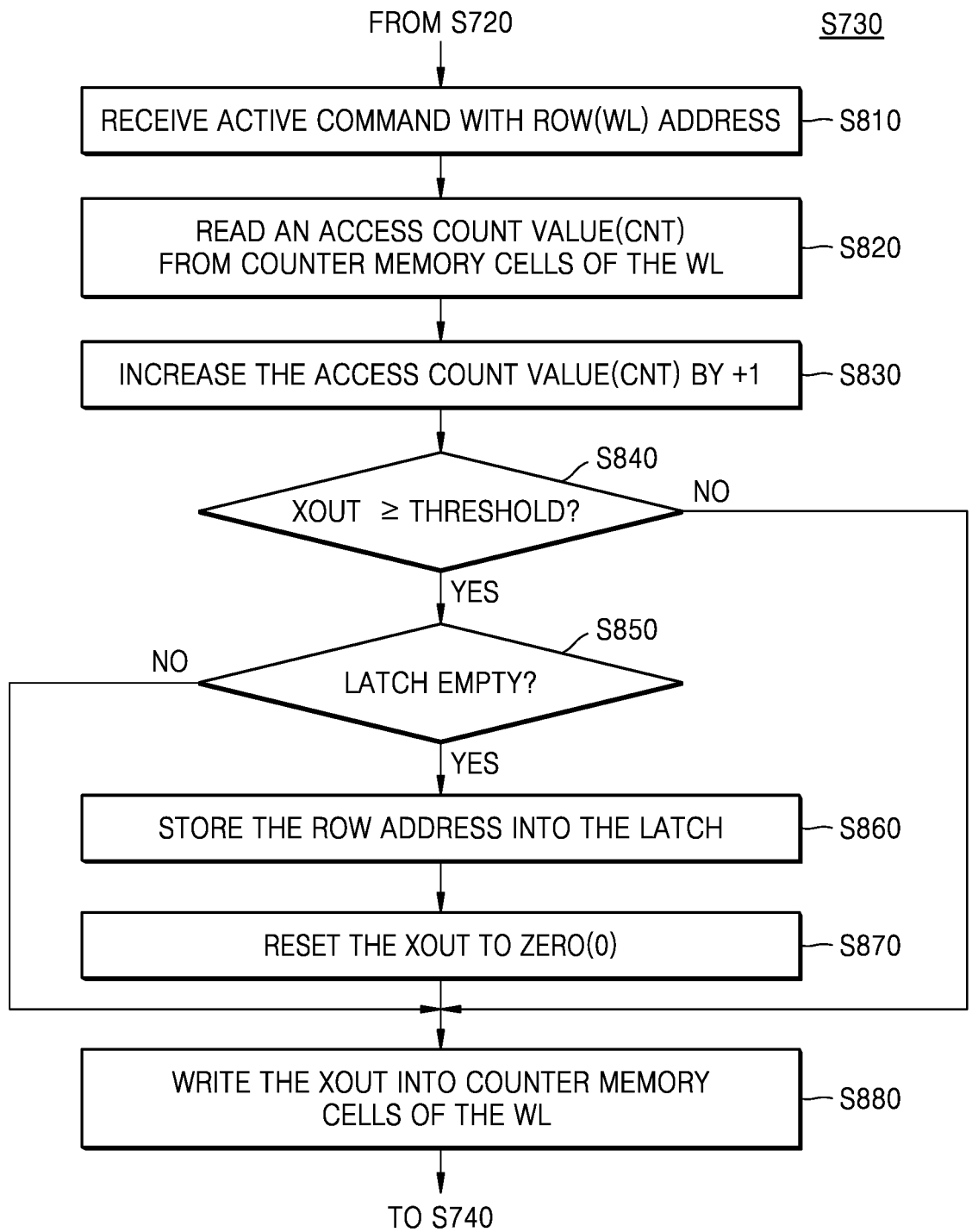
FIG. 8 is a flowchart illustrating an operation of a control logic circuit according to an embodiment of the present disclosure.

FIG. 8 is a flowchart illustrating an operation of a control logic circuit, according to an embodiment of the present disclosure. FIG. 8 is a flowchart specifically illustrating a counter-based latch hold operation (operation S730) for the monitored row hammer described with reference to FIG. 7.

Referring to FIG. 8 in conjunction with FIGS. 1 to 7, in operation S810, the control logic circuit 220 may receive the row address ROW_ADDR together with the active command ACT. The row address ROW_ADDR is configured to access the word line WL corresponding to the row address ROW_ADDR, and thus, the row address ROW_ADDR may be referred to as a word line WL address for the sake of convenience of description.

In operation S820, the control logic circuit 220 may read the access count value CNT stored in the counter memory cells 202 connected to the word line WL into the counter 510.

In operation S830, the control logic circuit 220 may increment the access count value CNT read in operation S820 by +1 and output the incremented access count value CNT as the access count value of the word line WL, that is, the output value XOUT of the counter 510.

In operation S840, the control logic circuit 220 may determine whether the output value XOUT of the counter 510, obtained in operation S830, is greater than or equal to the threshold value THRESHOLD. As a result of the determination, when the output value XOUT of the counter 510 is greater than or equal to the threshold value THRESHOLD (YES), the control logic circuit 220 may proceed to operation S850, and when the output value XOUT of the counter 510 is less than the threshold value THRESHOLD (NO), the control logic circuit 220 may proceed to operation S880. In operation S880, the control logic circuit 220 may store the output value XOUT of the counter 510 obtained in operation S830 in the counter memory cells 202 connected to the word line WL as the access count value of the word line WL.

In operation S850, the control logic circuit 220 may determine whether there is an empty latch in an address storage in the latch circuit 550 of the row hammer control circuit 210. As a result of the determination, when there is an empty latch in the address storage, the control logic circuit 220 may proceed to operation S860, and when there is no empty latch in the address storage, the control logic circuit 220 may proceed to operation S880. In operation S880, the control logic circuit 220 may store the output value XOUT of the counter 510 obtained in operation S830 in the counter memory cells 202 connected to the word line WL as the access count value of the word line WL.

In operation S860, the control logic circuit 220 may store the word line WL address having an access count value greater than or equal to the threshold value THRESHOLD in a latch of the address storage of the latch circuit 550. The latch circuit 550 may store the word line WL address in the latch of the address storage and activate the latch full signal LFULL indicating that the address storage is full to a logic high level.

In operation S870, the control logic circuit 220 may reset the output value XOUT of the counter 510 to zero, based on the latch full signal LFULL of a logic high level. In operation S880, the control logic circuit 220 may store the output value XOUT of zero of the counter 510, obtained in operation S870, in the counter memory cells 202 connected to the word line WL as the access count value CNT of the word line WL.

After operation S880 is performed, the control logic circuit 220 may proceed to operation S740 of FIG. 7 to determine whether the row hammer monitor time frame tREFi has elapsed and perform a normal refresh operation and/or a target row refresh operation for the row hammer address RH_ADDR in operation S750.

Figure 9:
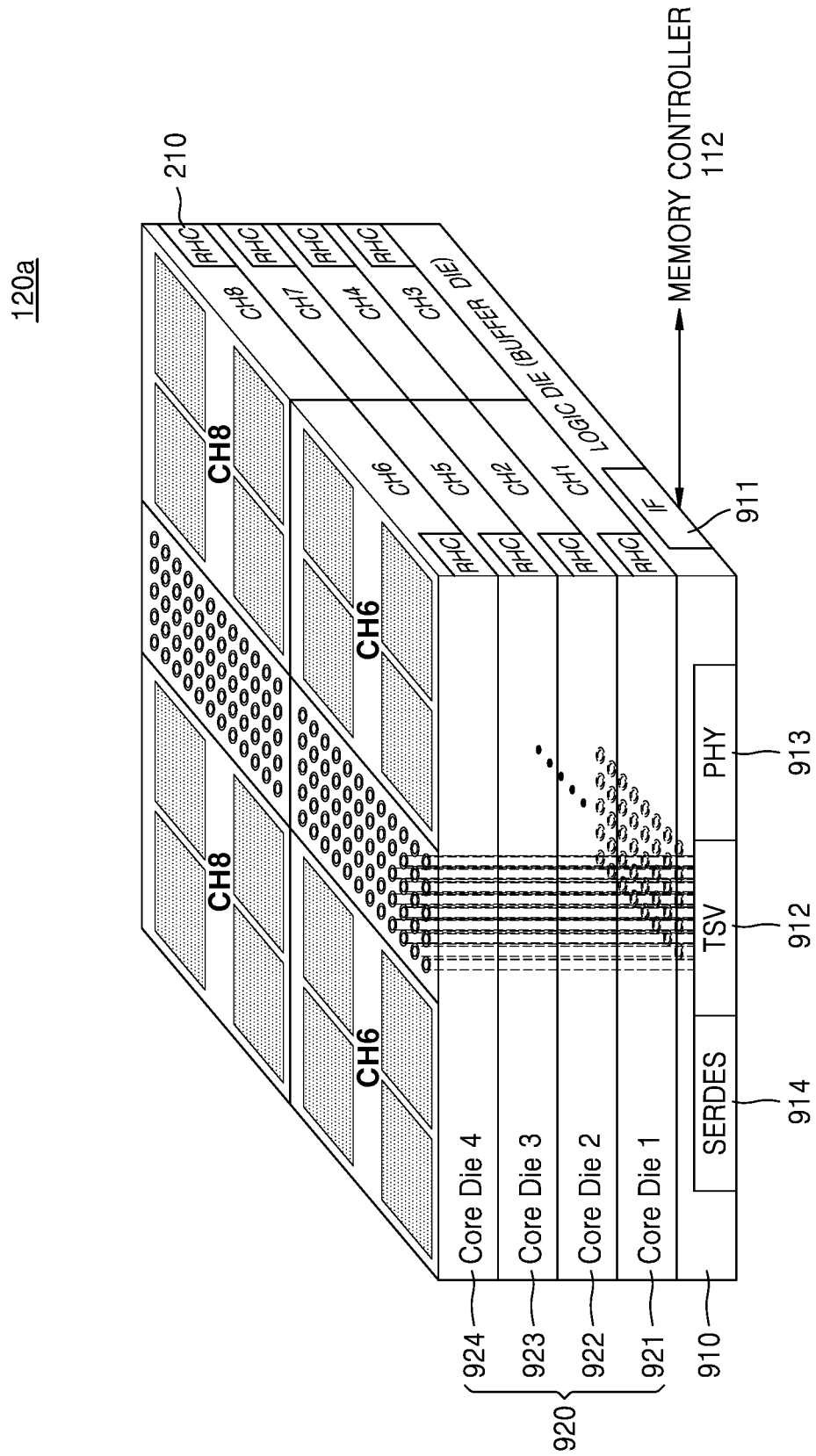
FIG. 9 is a view illustrating a memory device for controlling a row hammer, according to an example embodiment of the present disclosure.

FIG. 9 is a view illustrating a memory device for controlling a row hammer according to an example embodiment of the present disclosure. FIG. 9 illustrates the memory device 120 of FIG. 1 implemented in HBM. It may be noted that an HBM configuration illustrated in FIG. 9 is provided as an example and is not an actual HBM configuration. In addition, the present disclosure is not limited by an example of the HBM configuration illustrated in FIG. 9. Hereinafter, subscripts (for example, a of 120*a*) attached to the same reference numerals in different drawings are used to distinguish a plurality of circuits having similar or identical functions. For the sake of convenient description, a memory device 120*a* may hereinafter referred to as an HBM.

Referring to FIGS. 1 and 9, the HBM 120*a* may be connected to the host device 110 through an HBM protocol of the JEDEC standard. The HBM protocol is a high-performance random access memory (RAM) interface for three-dimensional stacked memories (for example, DRAM). The HBM 120*a* generally achieves a wider bandwidth while consuming less power in a substantially smaller form factor than other DRAM technologies (for example, DDR4, graphics DDR5 (GDDR5), and so on).

The HBM 120*a* may have a high bandwidth by including multiple channels CH1 to CH8 having interfaces independent of each other. The HBM 120*a* may include a plurality of dies, for example, a logic die 910 (or a buffer die) and one or more core dies 920 stacked on the logic die 910. FIG. 9 illustrates an example in which first to fourth core dies 921 to 924 are provided in the HBM 120*a*, but the number of core dies 920 may be variously changed. The core dies 920 may be referred to as memory dies.

Each of the first to fourth core dies 921 to 924 may include one or more channels. FIG. 9 illustrates an example in which each of the first to fourth core dies 921 to 924 includes two channels and the HBM 120*a* includes eight channels CH1 to CH8. For example, the first core die 921 may include a first channel CH1 and a third channel CH3, the second core die 922 may include a second channel CH2 and a fourth channel CH4, the third core die 923 may include a fifth channel CH5 and a seventh channel CH7, and the fourth core die 924 may include a sixth channel CH6 and an eighth channel CH8.

The logic die 910 may include an interface circuit 911 configured to communicate with the host device 110 and may receive command/address and data from the host device 110 through the interface circuit 911. The host device 110 may transmit the command/address and the data through the memory buses 130 corresponding to the first channel CH1 to the eighth channel CH8, and the memory buses 130 may be formed to be divided for each channel, or some of the memory buses 130 may be shared by at least two channels. The interface circuit 911 may transmit the command/address and the data to channels through which the host device 110 requests a memory operation or arithmetic processing. In addition, according to an example embodiment of the present disclosure, each of the core dies 920 or each of the channels may include a processor-in-memory (PIM) circuit.

The host device 110 may provide the command/address and the data such that at least some of a plurality of arithmetic operations or kernels may be performed by the HBM 120*a*, and a PIM circuit of a channel designated by the host device 110 may perform arithmetic processing. For example, when the received command and address indicate arithmetic processing, the PIM circuit of a corresponding channel may perform the arithmetic processing by using write data provided from the host device 110 and/or data read from the corresponding channel. In another example, when the command and address received through a corresponding channel of the HBM 120*a* indicate a memory operation, an access operation on data may be performed.

According to an embodiment, each of the first to eighth channels CH1 to CH8 may include a plurality of banks, and one or more processing elements may be provided in a PIM circuit in each of the first to eighth channels CH1 to CH8. For example, the number of processing elements in each channel may be equal to the number of banks, or one processing element may be shared among at least two banks when the number of processing elements is less than the number of banks. The PIM circuit in each of the first to eighth channels CH1 to CH8 may perform a kernel offloaded by the host device 110.

According to an embodiment, each of the first to eighth channels CH1 to CH8 may include a row hammer control circuit RHC described with reference to FIGS. 1 to 8 (row hammer control circuit 210). Each of the first to eighth channels CH1 to CH8 may include a memory cell array including a word line and a plurality of counter memory cells and a control logic circuit, and the plurality of counter memory cells may store an access count value of the word line. The row hammer control circuit RHC may monitor a row address that accesses a word line during a row hammer monitoring time frame, and when the number of times the word line is accessed is greater than or equal to a threshold value, the row hammer control circuit (RHC) may determine the row address to be a row hammer address and store the row address in an address storage. The row hammer control circuit RHC may hold up a determination operation for the next row hammer address, based on activation of a latch full signal indicating that there is no free space to store the row hammer address in the address storage. Accordingly, each of the first to eighth channels CH1 to CH8 may prevent the row hammer address stored in the address storage from being evicted or deleted until normally refreshed and/or target-refreshed, and thus, a RAS function may be increased.

In addition, the logic die 910 may further include a through silicon via (TSV) region 912, an HBM physical layer interface (HBM PHY) region 913, and a serializer/deserializer (SERDES) region 914. The TSV region 912 is a region in which a TSV for communication with the core dies 920 is formed and is a region in which the memory buses 130 corresponding to the first to eighth channels CH1 to CH8 are formed. When each of the first to eighth channels CH1 to CH8 has a bandwidth of 128 bits, the TSVs may include configurations for data input/output of 1024 bits.

The HBM PHY region 913 may include a plurality of input/output circuits for communication with the memory controller 112 and the first to eighth channels CH1 to CH8, and for example, the HBM PHY region 913 may include one or more interconnect circuits for connecting the first to eighth channels CH1 to CH8 to the memory controller 112. The HBM PHY region 913 may include a physical or electrical layer and a logical layer provided for signals, frequencies, timing, driving, detailed operating parameters, and functionality required for efficient communication between the memory controller 112 and the first to eighth channels CH1 to CH8. The HBM PHY region 913 may perform memory interfacing such as selecting a row and a column corresponding to a memory cell for a corresponding channel, writing data into the memory cell, or reading the written data from the memory cell. The HBM PHY region 913 may support features of an HBM protocol of a JEDEC standard.

The SERDES region 914 is a region for providing a SERDES interface of the JEDEC standard as processing throughput of a processor of the host device 110 increases and as requirements for a memory bandwidth increase. The SERDES region 914 may include a SERDES transmitter, a SERDES receiver, and a controller. The SERDES transmitter may include a parallel-to-serial circuit and a transmitter. The SERDES transmitter may receive a parallel data stream and serialize the received parallel data stream. The SERDES receiver may include a reception amplifier, an equalizer, a clock and data recovery circuit, and a serial-to-parallel circuit. The SERDES receiver may receive a serial data stream and parallelize the received serial data stream. The controller may include an error detection circuit, an error correction circuit, and registers such as first in first out (FIFO).

Figure 10:
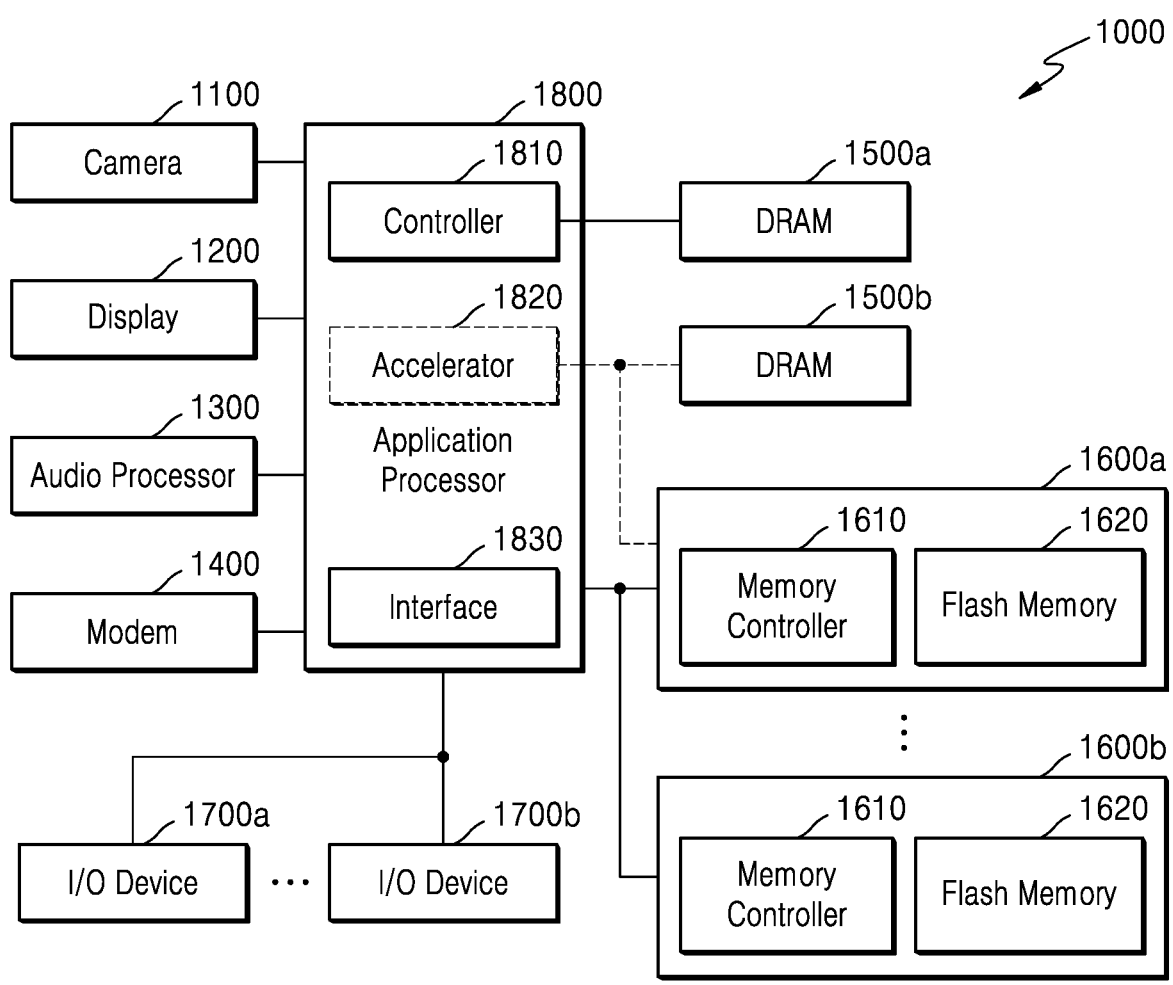
FIG. 10 is a block diagram illustrating a system including a memory device for controlling a row hammer, according to an embodiment of the present disclosure.

FIG. 10 is a block diagram illustrating a system including a memory device for controlling a row hammer, according to embodiments of the present disclosure.

Referring to FIG. 10, a system 1000 may include a camera 1100, a display 1200, an audio processor 1300, a modem 1400, DRAMs 1500a and 1500b, flash memory devices 1600a and 1600b, I/O devices 1700a and 1700b, and an Application Processor (AP) 1800. The system 1000 may be implemented as a laptop computer, a mobile phone, a smartphone, a tablet personal computer (PC), a wearable device, a healthcare device, and/or an internet of things (IOT) device. In addition, the system 1000 may be implemented as a server or a PC.

The camera 1100 may capture a still image or a moving image according to a user's control and may store the captured images or image data therein or transmit the captured images or image data to the display 1200. The audio processor 1300 may process audio data included in content of flash memory 1620 of the flash memory devices 1600a and 1600b or a network. The modem 1400 may modulate a signal and transmit the modulated signal through wired/wireless communication, and a receiver may receive and demodulate the modulated signal to obtain an original signal. The I/O devices 1700a and 1700b may include devices having a digital input function and/or a digital output function, such as a Universal Serial Bus (USB) or storage, a digital camera, a secure digital (SD) card, a digital versatile disc (DVD), a network adapter, and/or a touch screen.

The AP 1800 may entirely control an operation of the system 1000, such as through a controller 1810. The AP 1800 may control the display 1200 such that some of content stored in the flash memory 1620 of the flash memory devices 1600a and 1600b is displayed on the display 1200. When a user input is received through the I/O devices 1700a and 1700b, the AP 1800 may perform a control operation corresponding to the user input. The AP 1800 may include an accelerator block, which is a dedicated circuit for artificial intelligence (AI) data arithmetic, or may include an accelerator 1820 separate from the AP 1800. The DRAM 1500b may be additionally mounted in the accelerator block or the accelerator 1820. The accelerator 1820 may include a function block that professionally performs a certain function of the AP 1800, and the accelerator 1820 may include a GPU that is a function block for professionally processing graphics data, a neural processing unit (NPU) that is a block for professionally performing AI calculation and inference, and a data processing unit (DPU) that is a block for professionally transmitting data.

The system 1000 may include the plurality of DRAMs 1500a and 1500b. The AP 1800 may include an interface 1830 and may control the DRAMs 1500a and 1500b through command and mode register (MRS) settings conforming to the JEDEC standard or may set a DRAM interface protocol for communication in order to use company-specific functions such as a low voltage, a high speed, reliability, and a cyclic redundancy Check (CRC)/error correction code (ECC) function. For example, the AP 1800 may communicate with the DRAM 1500a through the interface 1830, which conforms to the JEDEC standard, such as, LPDDR4 or LPDDR5, and the accelerator block or the accelerator 1820 may set a new DRAM interface protocol for communication in order to control the DRAM 1500b for the accelerator 1820 having a higher bandwidth than the DRAM 1500a.

Only the DRAMs 1500a and 1500b are illustrated in FIG. 10 but are not limited thereto, and any type of memory, such as phase-change random access memory (PRAM), static random access memory (SRAM), magnetic random access memory (MRAM), resistive random access memory (RRAM), ferroelectrics random access memory (FRAM), or Hybrid random access memory may be used when satisfying a bandwidth, a response speed, and a voltage condition of the AP 1800 or the accelerator 1820. The DRAMs 1500a and 1500b have relatively less latency and a relatively smaller bandwidth than the I/O devices 1700a and 1700b or the flash memories 1620 of the flash memory devices 1600a and 1600b. The DRAMs 1500a and 1500b may be initialized when the system 1000 is powered on, used as temporary storages for an operating system and application data when the operating system and the application data are loaded, or used as execution spaces for various software code.

The DRAMs 1500a and 1500b may perform addition/subtraction/multiplication/division operations, a vector operation, address arithmetic, and/or fast Fourier transform (FFT) arithmetic. In addition, the DRAMs 1500a and 1500b may perform a function used for inference. Here, the inference may be performed by a deep learning algorithm using an artificial neural network. The deep learning algorithm may include a training operation of learning a model through various data and an inference operation of recognizing data by using the learned model. In an embodiment, an image captured by a user through the camera 1100 is signal-processed and stored in the DRAM 1500b, and the accelerator block or the accelerator 1820 may perform AI data arithmetic that recognizes data by using a function used for the data stored in the DRAM 1500b and the inference.

The system 1000 may include a plurality of storages or a plurality of flash memories 1620 in flash memory devices 1600a and 1600b having greater capacity than the capacity of the DRAMs 1500a and 1500b. The accelerator block or the accelerator 1820 may perform the training operation and the AI data arithmetic by using the flash memory devices 1600a and 1600b. In an embodiment, the flash memory devices 1600a and 1600b may perform more efficiently the training operation and the inference AI data arithmetic performed by the AP 1800 and/or the accelerator 1820 by using a computing device included in a memory controller 1610 in the flash memory devices 1600a and 1600b. The flash memory devices 1600a and 1600b may store pictures taken by the camera 1100 or data transmitted through a data network. For example, the flash memory devices 1600a and 1600b may store augmented reality/virtual reality, and high definition (HD) or ultrahigh definition (UHD) content.

The DRAMs 1500a and 1500b in the system 1000 may include the row hammer control circuit described with reference to FIGS. 1 to 8. The DRAMs 1500a and 1500b may each include a memory cell array including a word line and a plurality of counter memory cells and a control logic circuit, and the plurality of counter memory cells may store an access count value of the word line. The DRAMs 1500a and 1500b may monitor a row address that accesses a word line during a row hammer monitoring time frame, and when the number of times the word line is accessed is greater than or equal to a threshold value, the row hammer control circuit (RHC) may determine the row address to be a row hammer address and store the row address in an address storage. The DRAMs 1500a and 1500b may hold up a determination operation for the next row hammer address, based on activation of a latch full signal indicating that there is no free space to store the row hammer address in the address storage. Accordingly, the DRAMs 1500a and 1500b may prevent the row hammer address stored in the address storage from being evicted or deleted until normally refreshed and/or target-refreshed, and thus, a RAS function may be increased.

While the present disclosure has been particularly shown and described with reference to embodiments thereof, it will be understood that various changes in form and details may be made therein without departing from the spirit and scope of the following claims.

What is claimed is:

1. A memory device comprising:
    a memory cell array comprising a word line and a plurality of counter memory cells configured to store an access count value of the word line; and
    a control logic circuit configured to monitor a row address accessing the word line during a row hammer monitoring time frame and to determine the row address to be a row hammer address when a number of times the word line is accessed is greater than or equal to a threshold value, wherein the row hammer address is to be stored in an address storage,
    wherein the control logic circuit is configured to hold up a determination operation for a next row hammer address, based on activation of a latch full signal indicating no free space to store the row hammer address in the address storage.

2. The memory device of claim 1, further comprising a refresh control circuit configured to refresh a victim memory cell row physically adjacent to a memory cell row corresponding to the row hammer address stored in the address storage during the row hammer monitoring time frame.

3. The memory device of claim 1, wherein the control logic circuit is further configured to read the access count value of the word line from the plurality of counter memory cells connected to the word line corresponding to the row address, increment the read access count value by using a counter, and provide an output value of the counter as the number of times the word line is accessed.

4. The memory device of claim 3, wherein the control logic circuit is further configured to store the output value of the counter in the plurality of counter memory cells connected to the word line.

5. The memory device of claim 3, wherein the control logic circuit is further configured to reset the output value of the counter to zero when the number of times the word line is accessed is greater than or equal to the threshold value, and is further configured to store the reset output value of the counter in the plurality of counter memory cells connected to the word line.

6. The memory device of claim 1, wherein the control logic circuit further comprises a latch circuit, wherein the control logic circuit is further configured to generate an enable signal in a pulse form by using a pulse generator when the number of times the word line is accessed is greater than or equal to the threshold value, and wherein, in response to the enable signal having the pulse form, the latch circuit is further configured to store the row address in the address storage, and is configured to activate the latch full signal indicating no free space to store the row hammer address in the address storage.

7. The memory device of claim 1, wherein the control logic circuit is further configured to provide the row hammer address stored in the address storage to a refresh control circuit, in response to a refresh signal.

8. The memory device of claim 7, wherein the refresh signal is generated by a refresh command applied to the memory device.

9. The memory device of claim 1, wherein the control logic circuit is further configured to reset the address storage to a free space and to deactivate the latch full signal after the row hammer monitoring time frame has elapsed.

10. The memory device of claim 1, wherein the control logic circuit is further configured to use a basic refresh rate time specified in the memory device as the row hammer monitoring time frame.

11. A control logic circuit comprising:
    a counter configured to:
        count a number of times a word line is accessed by a row address during a row hammer monitoring time frame;
        read an access count value of the word line from a plurality of counter memory cells connected to the word line accessed by the row address;
        increment the read access count value; and
        output an output value of the counter as the number of times the word line is accessed by the row address;
    a comparator configured to compare the output value of the counter with a threshold value to determine whether the row address is a row hammer address; and
    a latch circuit configured to store the row hammer address in an address storage based on a determination of the comparator, and configured to activate a latch full signal indicating no free space to store the row hammer address in the address storage,
    wherein the output value of the counter related to a number of times accessing by a next row address is not provided to the comparator, in response to the activated latch full signal.

12. The control logic circuit of claim 11, wherein the counter is further configured to store the output value of the counter in the plurality of counter memory cells connected to the word line.

13. The control logic circuit of claim 11, wherein, when the row address is determined to be the row hammer address, the counter is configured to reset the output value of the counter to zero and is configured to store the reset output value of the counter in the plurality of counter memory cells connected to the word line.

14. The control logic circuit of claim 11, further comprising a logic circuit comprising a first input to which the output value of the counter is input, a second input to which the latch full signal is input, and an output from which the output value of the counter is provided to the comparator,
    wherein the logic circuit is configured to not provide the output value of the counter to the comparator when the latch full signal is activated.

15. The control logic circuit of claim 11, further comprising a pulse generator configured to receive an output signal of the comparator and output the output signal having a pulse form according to a logic level of the output signal of the comparator,
    wherein the latch circuit comprises a first input to which the output signal of the pulse generator is input and a second input to which the row address is input, and wherein the latch circuit is further configured to store the row address in the address storage and output the latch full signal, in response to the output signal having the pulse form.

16. The control logic circuit of claim 11, further comprising a row hammer address generator configured to output the row address stored in the address storage as the row hammer address, in response to a refresh signal.

17. The control logic circuit of claim 16, wherein the refresh signal is generated by a refresh command applied to a memory device comprising the control logic circuit.

18. The control logic circuit of claim 11, further comprising a refresh control circuit configured to refresh a victim memory cell row physically adjacent to a memory cell row corresponding to the row hammer address.

19. The control logic circuit of claim 11, wherein the address storage is reset to a free space after the row hammer monitoring time frame elapses.

20. The control logic circuit of claim 11, wherein a basic refresh rate time specified in a memory device comprising the control logic circuit is used as the row hammer monitoring time frame.

* * * * *